(12) United States Patent
Rassaian et al.

(10) Patent No.: US 7,623,994 B2
(45) Date of Patent: Nov. 24, 2009

(54) OBJECT ORIENTED ACOUSTIC MODELING TOOLS AND METHODS

(75) Inventors: Mostafa Rassaian, Bellevue, WA (US); David W. Twigg, Federal Way, WA (US)

(73) Assignee: The Boeing Company, Chicago, IL (US)

( * ) Notice: Subject to any disclaimer, the term of this patent is extended or adjusted under 35 U.S.C. 154(b) by 899 days.

(21) Appl. No.: 10/898,235

(22) Filed: Jul. 26, 2004

(65) Prior Publication Data

US 2006/0020456 A1 Jan. 26, 2006

(51) Int. Cl.
*G06F 7/60* (2006.01)
*G06F 17/10* (2006.01)

(52) U.S. Cl. .......................................... 703/2
(58) Field of Classification Search ........... 703/2
See application file for complete search history.

(56) References Cited

U.S. PATENT DOCUMENTS

| | | | | |
|---|---|---|---|---|
| 5,243,665 A | * | 9/1993 | Maney et al. | 382/152 |
| 6,069,634 A | * | 5/2000 | Gibson | 345/424 |
| 6,687,659 B1 | * | 2/2004 | Shen | 703/2 |
| 6,728,664 B1 | * | 4/2004 | Fouad | 703/2 |
| 6,751,580 B1 | * | 6/2004 | Cope et al. | 703/2 |
| 2002/0010399 A1 | * | 1/2002 | Konofagou et al. | 600/449 |

OTHER PUBLICATIONS

R.M. Koch, M.H. Gross, F.R. Carls, D.F. von Buren, G. Frankhauser, Y.I.H. Parish, "Simulating Facial Surgery Using Finite Element Models", ACM 1996, ACM-0-89791-746-4/96/008, pp. 421-428.*
F. Henroote, B. Meys, H. Hedia, P. Dular, W. Legros, "Finite Element Modeling with Transformation Techniques" IEEE transactions on Magnets, vol. 35, No. 3, May 1999, pp. 1434-1437.*
Anton V. Mobley, et al., "An Object Oriented Approach to Geometry Defeaturing for Finite Element Meshing", Proc. $7^{th}$ Int. Meshing Roundtable, Oct. 26, 1998, 17 pages, XP 002378996.
Malcolm J. Panthaki et al., "An Object-Oriented Virtual Geometry Interface", Proc. $6^{th}$ Annual Int. Meshing Roundtable, Oct. 13, 1997, 15 pages, XP 002378997.
S. Agostinelli, et al., "Geant4-a simulation toolkit", Nuclear Instruments and Methods in Physics Research, Jul. 1, 2003, pp. 250-303, vol. 506, No. 3, XP 004431463.
Marc Levoy, "Efficient Ray Tracing of Volume Data", ACM Transactions on Graphics, Jul. 1990, pp. 245-261, vol. 9, No. 3, XP002913630.

(Continued)

*Primary Examiner*—Paul L Rodriguez
*Assistant Examiner*—Dwin M Craig (57) ABSTRACT

Techniques for creating an acoustic model from a finite element mode include strategically partitioning elements of the finite element model into sets, forming composite centroids from the partitioned elements and then calculating the spatial distances between the composite centroids so that an acoustic model can be created using a tiny portion of the computational power otherwise required. By further constraining the composite model to conform to an M-by-N array, object-oriented code can be used.

36 Claims, 9 Drawing Sheets

OTHER PUBLICATIONS

Steffen Marburg, "A general concept for design modification of shell meshes in structural-acoustic optimization—Part I: formulation of the concept", Finite Elements in Analysis and Design, Jun. 2002, pp. 725-735, vol. 38, No. 8, XP002379283.

Steffen Marburg, et al., "A general concept for design modification of shell meshes in structural-acoustic optimization—Part II: Application to a floor panel in sedan interior noise problems", Finite Elements in Analysis and Design, Jun. 2002, pp. 737-754, vol. 38, No. 8, XP002379284.

J.A. Eaton, et al., "Application of the Finite Element Method to Acoustic Scattering Problems", AAIA Journal, Jan. 1, 1996, pp. 29-34, vol. 34, No. 1, XP009065980.

* cited by examiner

OBJECT ORIENTED ACOUSTIC MODELING TOOLS AND METHODS

FIELD OF THE INVENTION

This invention relates to methods and systems for conducting acoustic studies using finite element modeling.

BACKGROUND OF THE INVENTION

While the Finite Element Model (FEM) is known as a tool useful for determining the integrity of a given mechanical structure, the Finite Element Model also has a number of other uses. For example, the same FEM that can be used to predict the structural integrity of an aircraft door can also be used to develop an acoustic model to predict how the door will conduct sound. Unfortunately, FEMs rarely lend themselves to computational efficiency, and when used to predict acoustic behavior, the computational power required to develop a FEM-based acoustic model increases exponentially with every added element. Accordingly, new methods and systems related to improving the computational requirements of acoustic models are desirable.

SUMMARY OF THE INVENTION

In various embodiments, a method for creating an acoustic model of a structure is based on a finite-element model of the structure is disclosed. For example, in various embodiments such a method can include the steps of determining at least one composite centroid based on a first set of two or more first elements and determining a cross-spectral correlation function based on the composite centroid.

In one aspect, an apparatus for creating an acoustic model of a structure based on a pre-existing finite element model of the structure includes a partitioning device configured to partition elements of a finite element model into a plurality of sets with at least a first set having a plurality of elements, and a centroid determining device configured to determine a composite centroid based on the elements of the first set.

In another aspect, a storage medium stores a plurality instructions in the form of object-oriented routines that if executed, enables a processor-based system to operate on a finite element model to create an acoustic model of a structure.

In yet another aspect, a second storage medium stores a plurality instructions that if executed, enables a processor-based system to operate on a finite element model representing a structure and containing a plurality of elements, the instructions including a first set of instructions capable of creating a composite centroid from a subset of the finite element model elements, a second set of instructions capable of calculating the spatial distances between the composite centroid and a second centroid, and a third set of instructions capable of determining an acoustic function of the structure based on the calculated spatial distance.

There has thus been outlined, rather broadly, certain embodiments of the invention in order that the detailed description thereof herein may be better understood, and in order that the present contribution to the art may be better appreciated. There are, of course, additional embodiments of the invention that will be described or referred to below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

The inventors of the disclosed methods and systems have created an entirely new approach to creating acoustic models using a fraction of the computational power required by conventional approaches. Other advantages of the various novel inventions include, but are not limited to, the capacity to use object-oriented computer code to perform acoustic modeling, thus increasing the portability and reliability of acoustic modeling systems.

Figure 1:
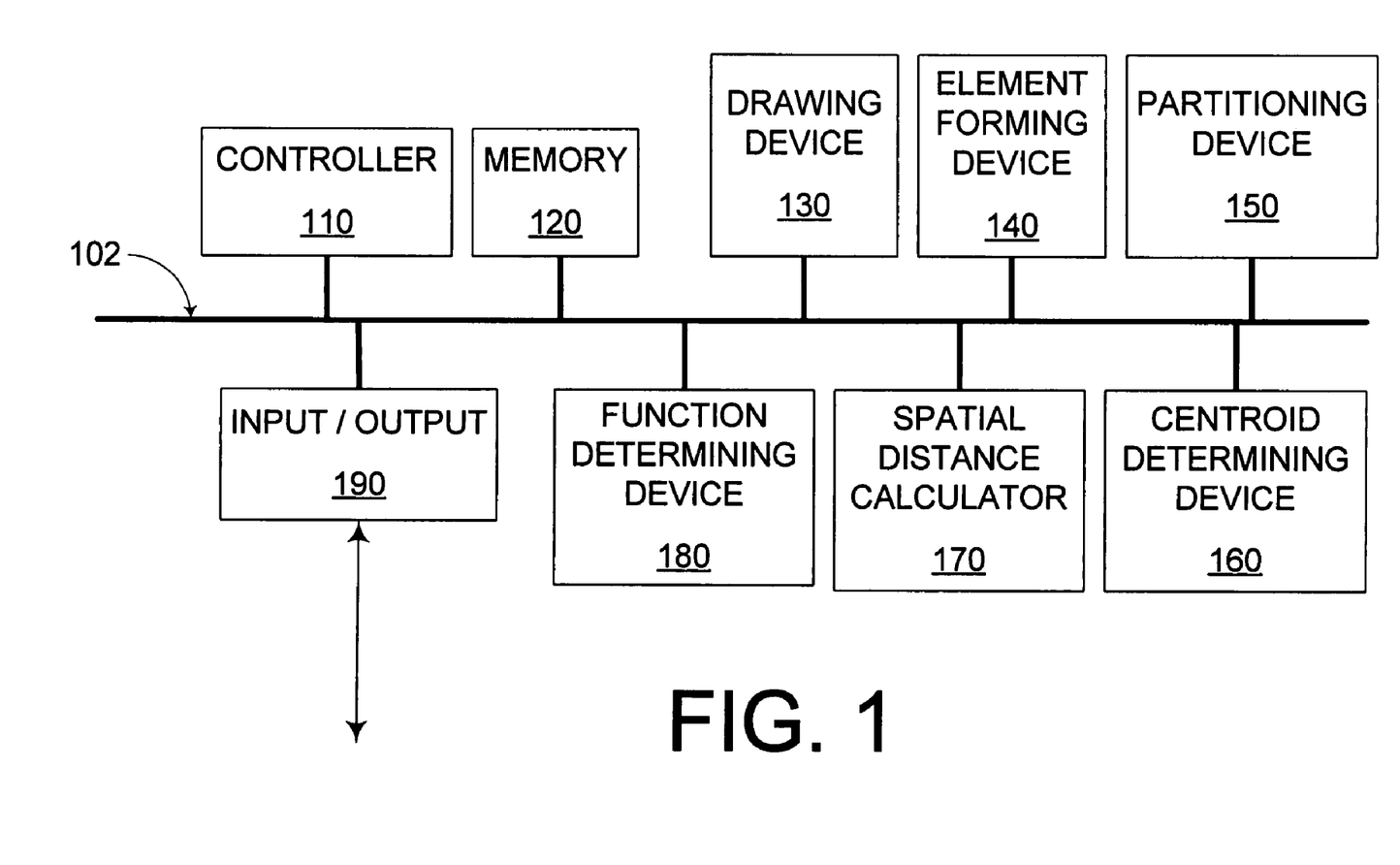
FIG. 1 is a block diagram of an apparatus capable of efficiently forming an acoustic model based on a finite element model of a structure.

FIG. 1 is an exemplary modeling device 100 according to the disclosed methods and systems. As shown in FIG. 1, the exemplary modeling device 100 includes a controller 110, a memory 120, a drawing device 130, a element-forming device 140, a partitioning device 150, a centroid-determining device 160, a spatial distance calculator 160, a function-determining device 180 and an input/output device 190. The above components 110-190 are coupled together by control/data bus 102.

Although the exemplary modeling device 100 of FIG. 1 uses a bussed architecture, it should be appreciated that any other architecture may be used as is well known to those of ordinary skill in the art.

It also should be appreciated that some of the above-listed components can take the form of software/firmware routines residing in memory 120 and capable of being executed by the controller 110. Further, it should be understood that the functions of any or all of components 130-180 can be accomplished using object-oriented software, thus increasing portability, software stability and a host of other advantages not available with non-object-oriented software.

In operation, an operator using the modeling-device 100 can first create a structure of interest, which may or may not take the form of a wire-frame geometry; a "wire-frame geometry" being a form of skeletal outline of the structure. Subsequent to creating a structure, the operator can access the element-forming device 140 where he may divide the structure into a plurality of elements.

Figure 2:
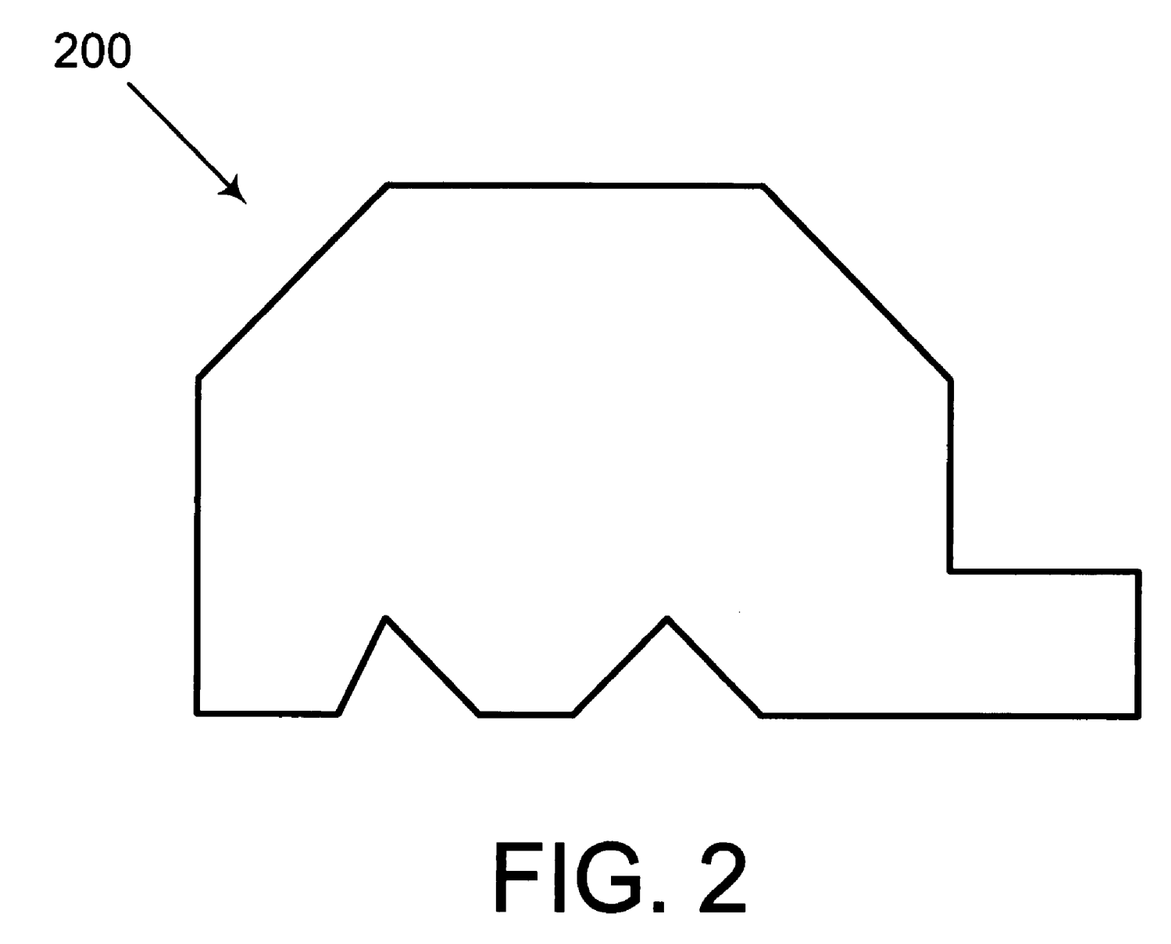
FIG. 2 depicts an exemplary structure.
Figure 3:
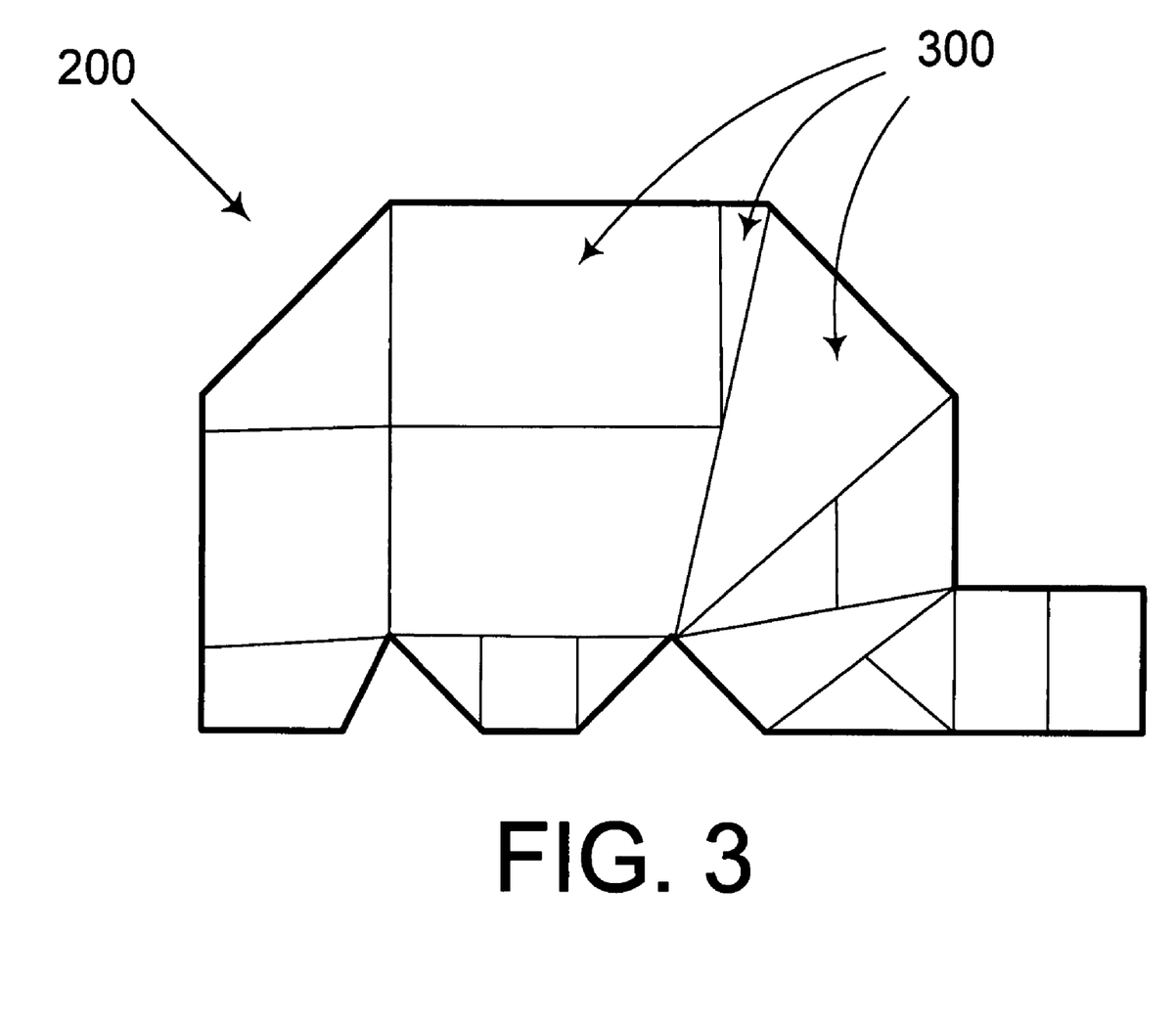
FIG. 3 depicts the structure of FIG. 2 divided into elements.

FIG. 2 depicts an exemplary structure 200 that for the purpose of this disclosure is useable to explain the function of the various components of FIG. 1. FIG. 3 depicts the structure 200 of FIG. 2 divided into 17 separate elements 300. As shown in FIG. 3, the various elements 300 do not need any special structure, such as a mesh-like regular structure of elements that might be automatically produced from a wire-frame geometry. While the apparatus 100 of FIG. 1 is capable of generating a FEM by virtue of the drawing device 130 and the element-forming device 140, it should be appreciated that the apparatus 100 can alternatively import any number of finite element models via input/output device 190 as may be desired or useful.

Figure 4:
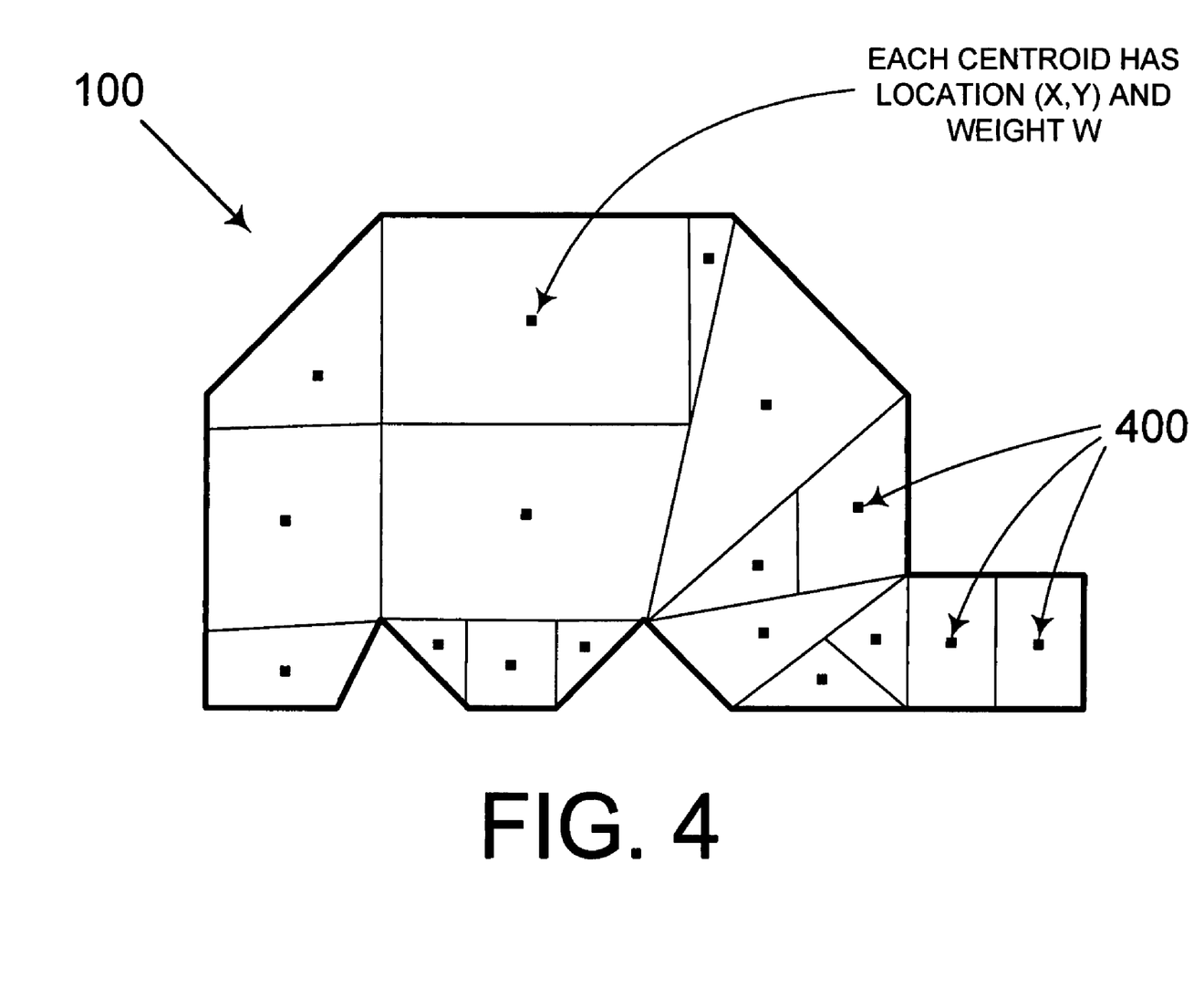
FIG. 4 depicts the centroids of the elements of FIG. 3.

Regardless of a structure's origin, once the elements are formed the partitioning device 150 can be used determine the centroids of each element (assuming that such centroids are not pre-defined in an imported FEM). Referring to FIG. 4, which depicts the centroid 400 for each element 300, it should be noted that for the purposes of this disclosure a "centroid" can be defined as point representing the spatial mean position of a body's mass. For example, a centroid of a circle or square (having uniform density) will be at the exact center of the circle/square.

In addition to an X-Y spatial position for each polygon (or X-Y-Z position for three-dimensional representations, e.g., polyhedrons), a centroid can also be represented by a weight W that can vary from element to element. For instance, referring to FIG. 4 an assuming uniform density throughout structure 100 it is apparent that the centroid of the top-center rectangle can have a greater weight than the centroid of the much smaller rectangle located at the lower-rightmost portion of structure 100.

Once all the centroids 400 are determined, the partitioning device 150 can partition the elements 300 into separate "composite" sets of elements using partitioning device 150. Generally, such partitioning can be done in a number of ways. For example, in various embodiments, an operator can look for clusters of closely-spaced centroids and define composite sets as a matter of personal judgment. In other embodiments, composite sets can be defined using any number of useful partitioning tools, such as software capable of detecting clusters and so on.

Regardless of the various useable partitioning approaches that can be used, the inventors of the disclosed methods and systems have developed an approach that not only reduces overall computational requirements, but lends itself to manipulation by object-oriented code. For example, referring to FIG. 5A, it is apparent that a array 500 of regularly-spaced rectangles can be superimposed over structure 100, and that the centroids 400 of each element 300 will fall within one of the available rectangles {(1,1), (1, 2) . . . (2, 4)}.

Figures 5A, 5B:
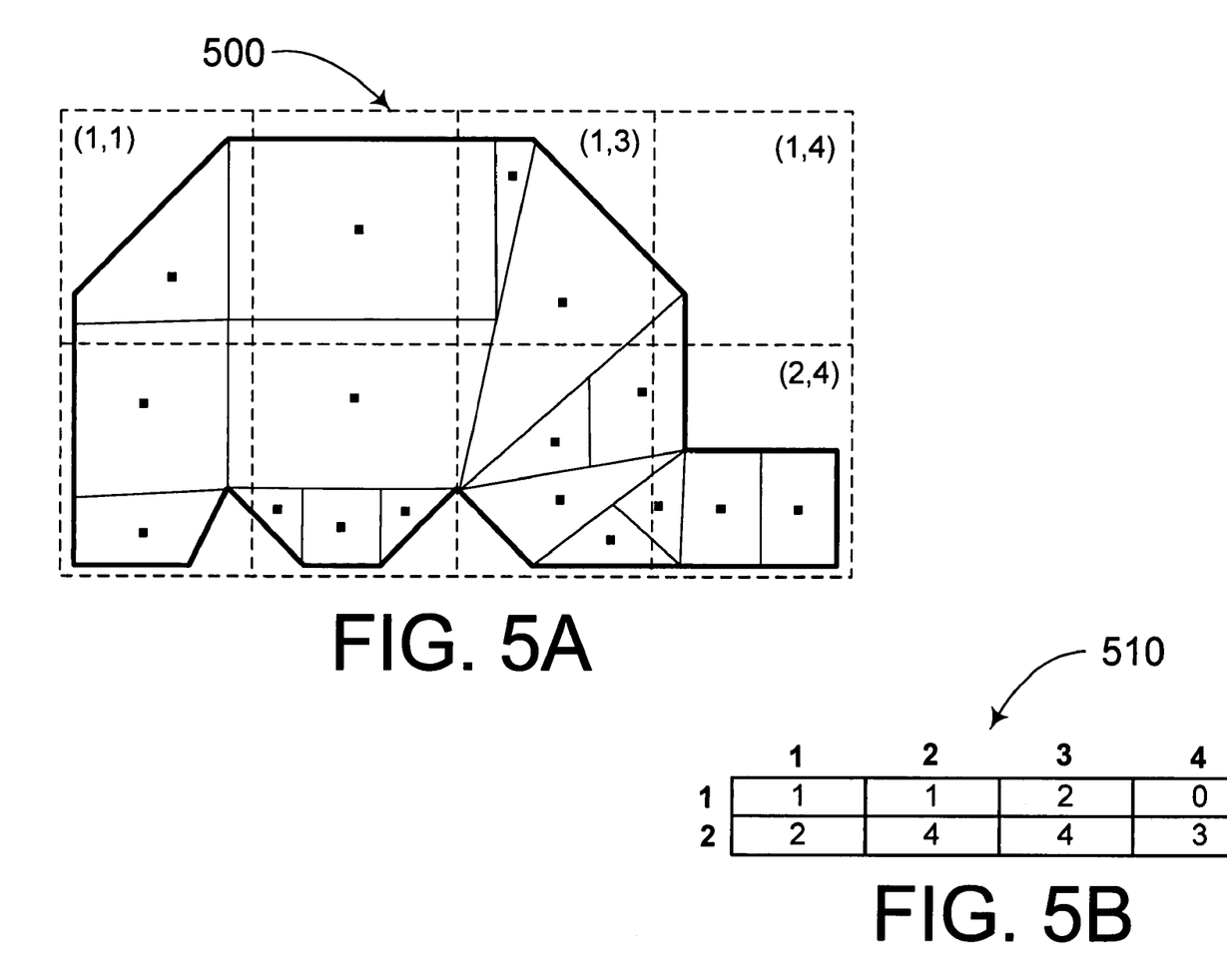
FIGS. 5A and 5B depict a partitioning of the elements shown in FIGS. 3-4.

While a 2-by-4 array is used for the present example, it should be appreciated that for modeling any particular structure, arrays having greater resolution, i.e., more constituent parts, can be used to provide greater accuracy acoustic models at the cost of greater computational requirements, while smaller arrays can be used to produce models of lesser accuracy but at the benefit of greatly reduced computational requirements. While choosing the optimal appropriate sized array can be an issue of judgment, the inventors of the disclosed methods and systems have discovered that an appropriately-sized array can result in an acoustic model requiring less than 10% of the processing power of a conventional acoustic model based on the original FEM while only resulting in a loss of less than 2% accuracy.

Again returning to FIG. 5A, it should be appreciated that the M-by-N rectangular-nature of array 500 also lends itself to manipulation by object-oriented code.

An "object" is a software module that contains a collection of related procedures and data. Each object can have a basic purpose or function that it performs. Unlike non-object oriented software where code and data are separate, each object contains the data used in performing its function as well as the code. It is self-contained. Constructed properly, object-oriented software has many advantages over non-object oriented software. For example, object-oriented software is more stable and less prone to crashing when changes are made, particularly in the case of complex systems. Because the code and data are co-located within each object, they don't fall out of synch when software is changed, which is a common problem of traditional non-object-oriented systems. By virtue of using an M-by-N array, the present systems and methods can provide a set of object-oriented software routines that can be consistently reused with minimum software development and maintenance costs.

Returning to FIG. 1, the partitioning device 150 of the present methods and systems can partition the various elements 200 based on where their centroids 300 fall in relation to the various rectangles of array 500. As can be seen by FIG. 5A, each centroid 300 will generally fall into a distinct rectangle (or otherwise relegated to an appropriate rectangle given a tie) in a manner as to partition the various element 300 into disjoint sets of elements. In mathematics, two sets are considered disjoint if they have no elements in common. Referring to table 510 of FIG. 5B, it is demonstrated that the array 500 of FIG. 5A can be used to partition the original 17 elements into 8 disjoint sets with rectangle (1,1) having 1 element, rectangle (1,2) having 1 element, rectangle (1,3) having 2 elements and so on.

Again referring to FIG. 1, once the various elements of a structure are partitioned, the centroid determining device 160 can be used to determine the "composite centroid" for each set: a "composite centroid" being defined as the center of mass for all elements of a given set. Generally, such a composite centroid can be determined using just the spatial position and weight of each element of a set. However, the particular approach to determining composite centroids can take any number of forms as long as accurate results are produced.

Figure 6A:
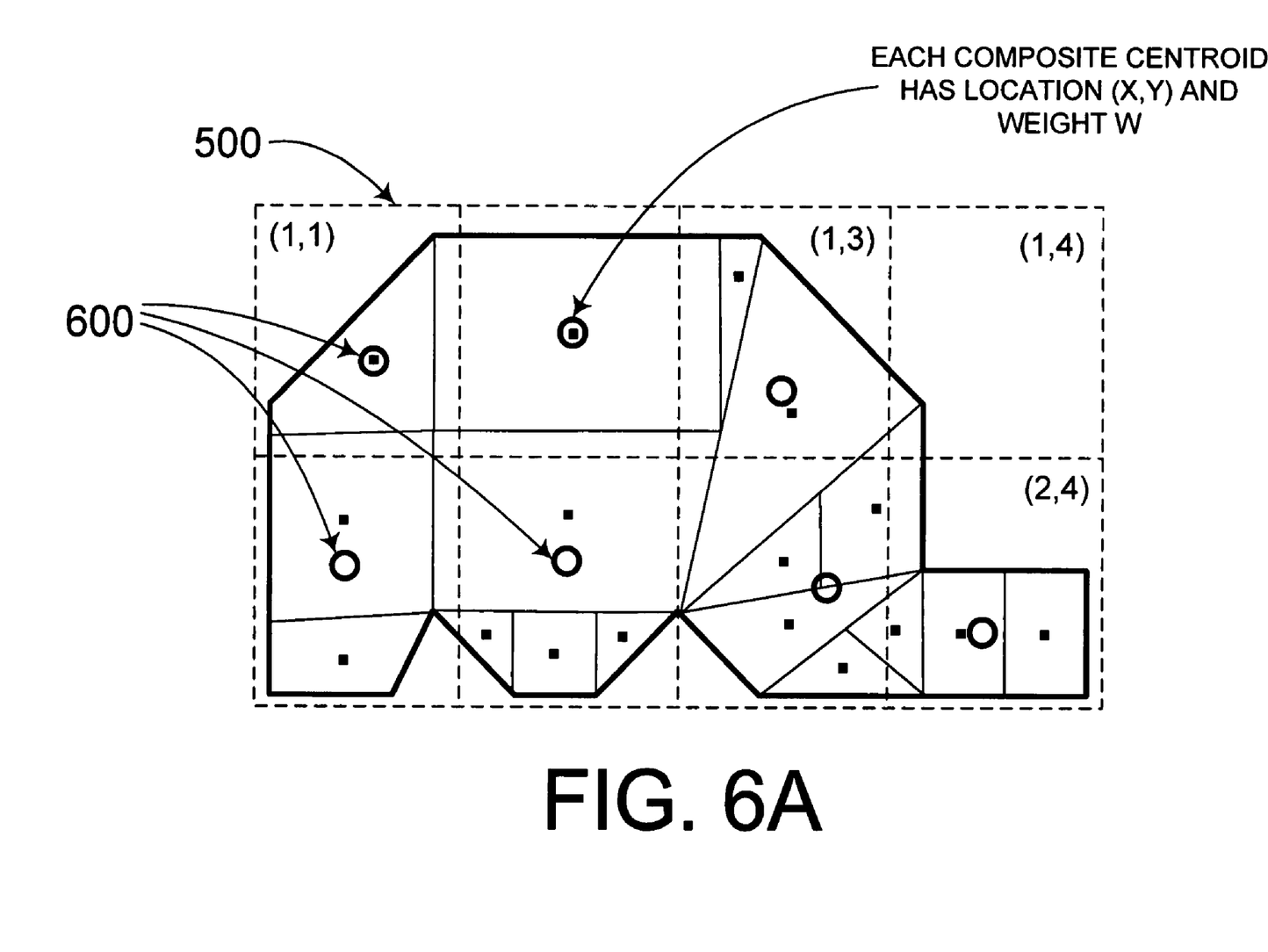
FIGS. 6A and 6B depict composite centroids generated from the partitioned elements of FIG. 5A.
Figure 6B:
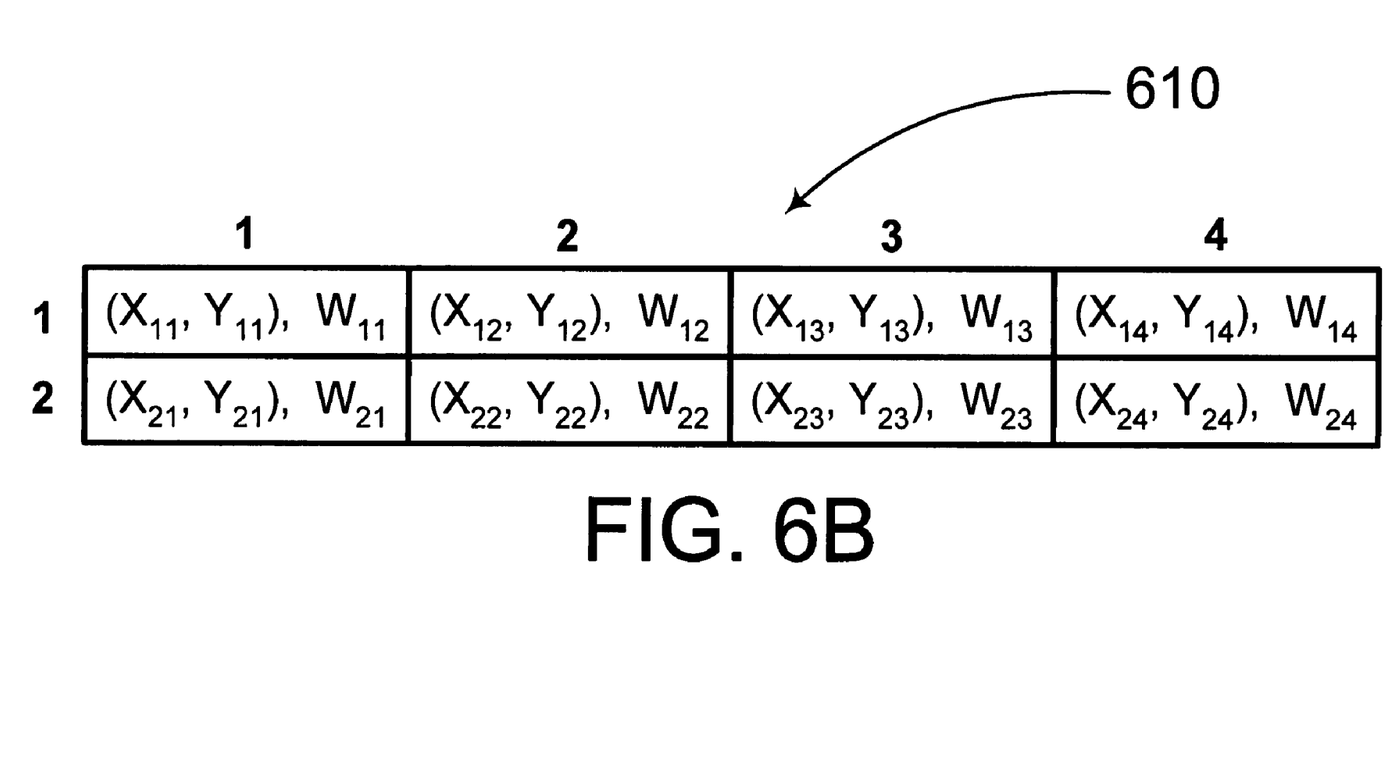

FIG. 6A depicts the composite centroids 600 (shown as small circles) for the various composite sets of elements (acknowledging that set (1,4) will have no composite centroid). The table 610 subsequently indicates that each composite centroid 600 of FIG. 6A will have a spatial position $(X_{11}, Y_{11}), (X_{12}, Y_{12}) \ldots (X_{24}, Y_{24})$ as well as a weight $W_{11}, W_{12} \ldots W_{24}$.

Figure 7:
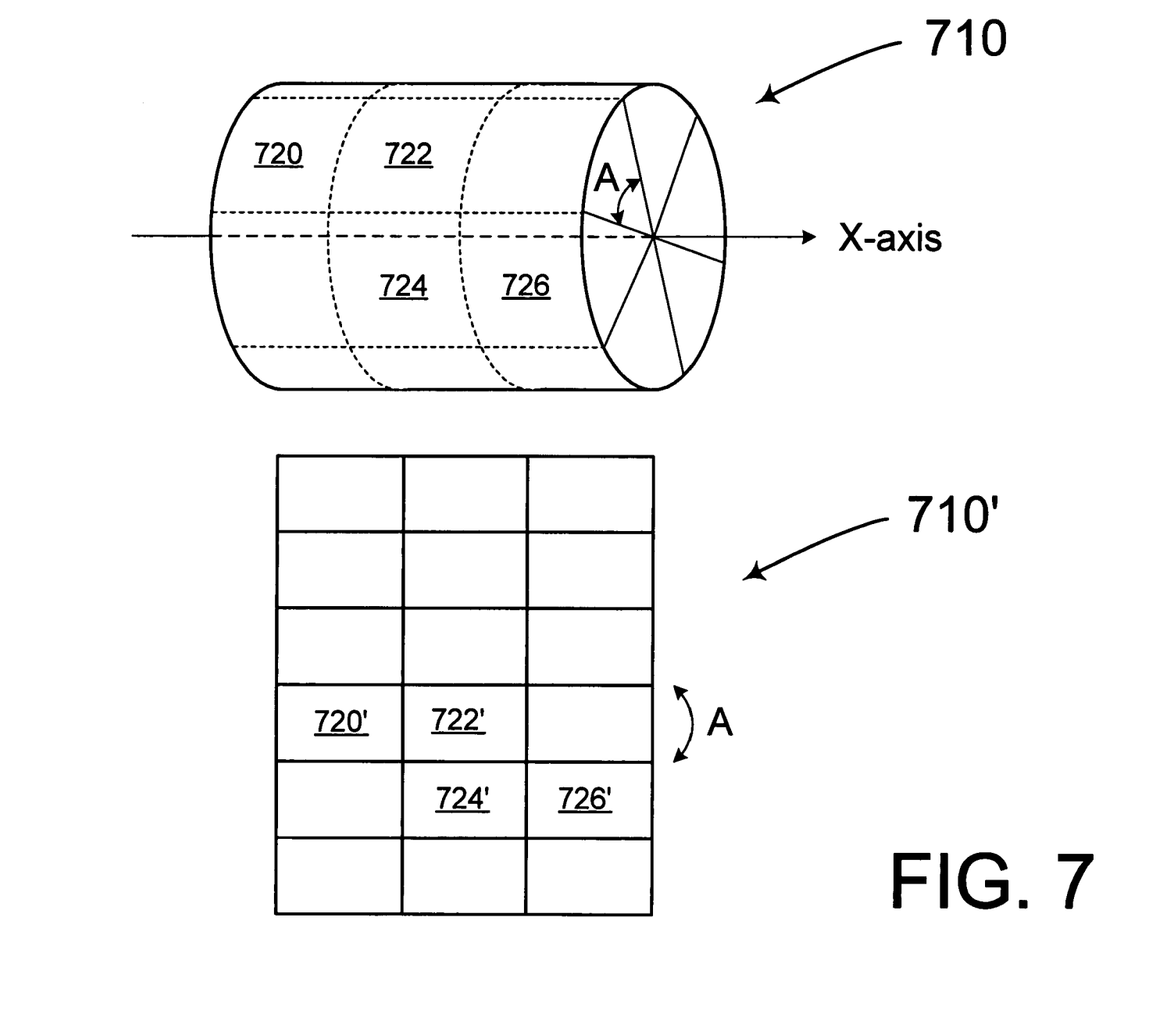
FIG. 7 depicts a geometric transform from cylindrical to Cartesian space useful for forming an acoustic model

In addition working in structures using Cartesian coordinates, it should be appreciated that it can be advantageous or necessary to work in other coordinate systems, such as the coordinate systems of cylindrical or spherical spaces. FIG. 7 depicts such an example where the methods and systems of the present disclosure are adapted for a cylindrical structure 710. As shown in FIG. 7, the cylindrical structure 710 can be represented by a coordinate system having an X-axis, a Y-distance extending from the X-axis and an angle θ circling about the X-axis.

As is also shown in FIG. 7, the cylindrical structure 710 can be divided into a number of wedges having angle A, and the wedges further can be divided into sections, such as sections 720-726. As should be apparent in FIG. 7, the cylindrical structure 710 can be represented using an M-by-N rectangular-array 710' having various elements, including elements 720'-724', which represent respective sections 720-724. As should also be apparent from FIG. 7, the cylindrical structure 710 can now be analyzed in a fashion similar to the structure 200 of FIG. 2

Returning again to FIG. 1, once determined the spatial positions of the composite centroids can then be provided to the spatial distance calculator 170. The spatial distance calculator 170, in turn, can calculate the distances between each composite centroid. Subsequently, the composite centroid spatial positions, composite centroid weights and relative distances between centroids can be provided to the function determining device 180. The function determining device 180, in turn, can determine the cross-spectral acoustic function of the structure of interest. The cross-spectral acoustic function of a structure can be thought of as a model that describes/predicts how the structure will react to an acoustic stimulus, such as an external noise source. The exemplary function determining device 180 can use any variation of a cross-spectral correlation process as is well-known in the relevant arts. While the exemplary function determining device 180 can take the form of a number of object-oriented routines, it should be appreciated that, in various embodiments, the particular approach and devices used to developing acoustic models can vary as desired or otherwise required.

Figure 8:
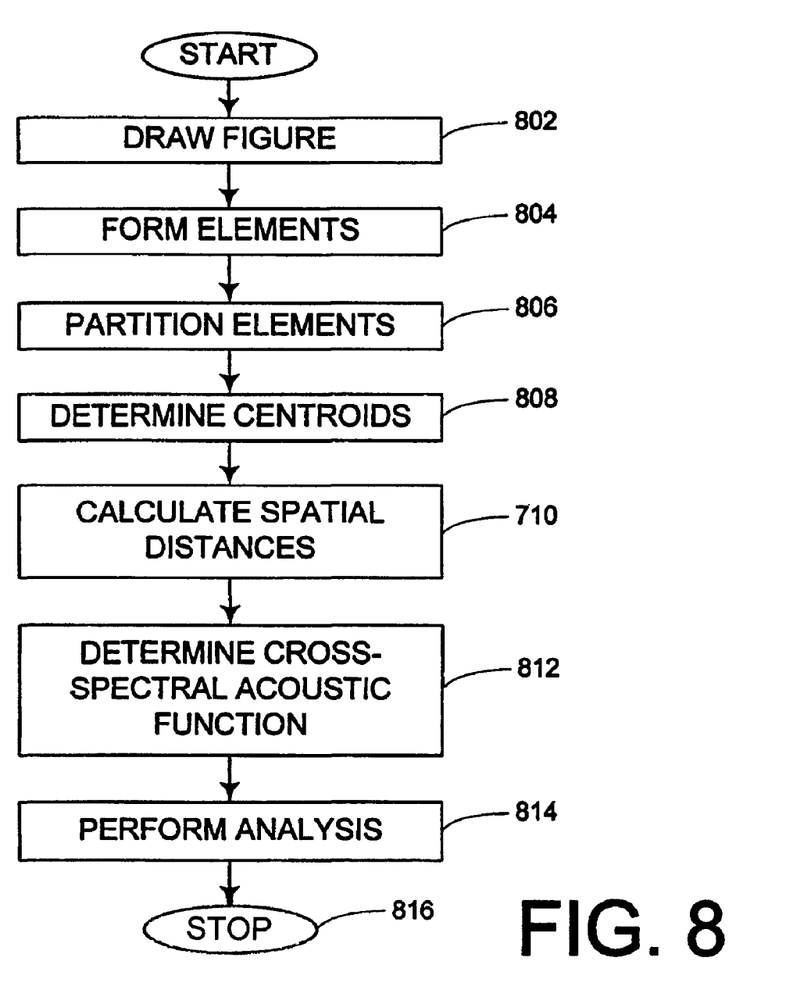
FIG. 8 is a flowchart outlining an exemplary operation for forming finite element models.

FIG. 8 is a flowchart outlining an exemplary operation according to the present disclosure for developing an acoustic model. The process starts at step 802 where a structure is created. Next, in step 804, the structure of step 802 is divided into elements as might be found in a FEM for example. Then, in step 806, the elements are partitioned into sets. Control continues to step 808.

In step 808, composite centroids are determined for each partitioned set of step 806. Next, in step 810, the spatial distances between composite centroids are determined. Then, in step 812, an acoustic function of the structure of step 802 is determined using the spatial distance information generated in step 810 as well as the composite centroid data itself. Control continues to step 814.

In step 814, an acoustic analysis of the structure of step 802 can be performed using the acoustic model function of step 812, and control continues to step 816 where the process stops.

While the various inventive aspects of this disclosure have been generally described with regard to two-dimensional systems, it should be appreciated that the disclosed methods and systems can be applicable for three dimensional analysis. Accordingly, when extrapolating the disclosed and implicit concepts from two to three dimensions, the appropriate nomenclature may change. For example, in a two-dimensional embodiment one might describe the various relevant elemental shapes as "lines"/"arcs", "triangles" and "squares" ("polygons" in general), whereas the three-dimensional equivalents might better be described as "tetrahedrons", "pentahedrons" and "hexahedrons" ("polyhedrons" in general).

Further, while one might appropriately describe an M-by-N array as "rectangular" (or double-scripted), perhaps a more appropriate term for an M-by-N-by-P array might be a "pillar" array. Regardless of the better technical term, for the purpose of this disclosure a pillar array may still be correctly referred to as rectangular in nature.

In various embodiments where the above-described systems and/or methods are implemented using a programmable device, such as a computer-based system or programmable logic, it should be appreciated that the above-described systems and methods can be implemented using any of various known or later developed object or non-object oriented programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device, such as a computer, to implement the above-described systems and/or methods. Once an appropriate device has access to the information and programs contained on the storage media, the storage media can provide the information and programs to the device, thus enabling the device to perform the above-described systems and/or methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods and coordinate the functions of the individual systems and/or methods related to acoustic modeling.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for creating an acoustic model of a structure based on a finite-element model of the structure, the method being performed by computer-executable instructions stored on a computer readable storage media that, when executed on a processor, perform a method comprising:

retrieving a finite-element model having a plurality of elements with each element having a centroid;

determining at least one composite centroid based on a first set of two or more first elements, the composite centroid having a spatial position and weight, the composite centroid being stored on the computer readable storage media;

determining a cross-spectral correlation function of the structure based on the composite centroid; and predicting a reaction of the structure to acoustic stimuli using the cross-spectral correlation function as the acoustic model of the structure.

2. The method of claim 1, further comprising calculating the spatial distance between the composite centroid and a second centroid, and wherein the cross-spectral correlation function is determined based on the calculated spatial distance.

3. The method of claim 1, wherein determining at least one composite centroid includes determining a plurality of composite centroids, and wherein each composite centroid is formed from a set of elements having no common elements with sets of other composite centroids.

4. The method of claim 1, wherein the first set is determined based on the position of each centroid of each element of the first set.

5. The method of claim 3, wherein the each set is partitioned based on the position of each centroid of each element of each set.

6. The method of claim 5, wherein the each set is determined based on the centroid position of each element relative to a collection of polygons superimposed over the structure.

7. A method for creating an acoustic model of a structure based on a finite-element model of the structure, the method being performed by computer-executable instructions stored on a computer readable storage media that, when executed on a processor, perform a method comprising:

retrieving a finite-element model having a plurality of elements with each element having a centroid;

determining at least one composite centroid based on a first set of two or more first elements, the composite centroid having a spatial position and weight, the composite centroid being stored on the computer readable storage media;

determining a cross-spectral correlation function of the structure based on the composite centroid; and predicting a reaction of the structure to acoustic stimuli using the cross-spectral correlation function as the acoustic model of the structure;

wherein the each set is determined based on the centroid position of each element relative to a regular array superimposed over the structure.

8. The method of claim 7, wherein the regular array is an M-by-N array of rectangles, and wherein M and N are both integers having a value greater than 1.

9. The method of claim 8, wherein the step of determining at least one composite centroid is performed using a number of object-oriented software routines configured to manipulate at least one of a rectangular array of elements and a rectangular array of composite centroids.

10. The method of claim 1, wherein the step of determining at least one composite centroid is performed using at least one object-oriented software routine designed to automatically determine composite centroids from elements of a finite element model.

11. The method of claim 1, wherein the elements are derived based on a non-Cartesian coordinate system.

12. The method of claim 11, wherein the elements are derived based on a cylindrical coordinate system.

13. An apparatus for creating an acoustic model of a structure based on a pre-existing finite element model of the structure, the apparatus comprising:

a processor;

a memory containing computer-executable instructions that, when executed on the processor, perform a method comprising the steps of;

partitioning elements of the finite element model into a plurality of sets with at least a first set having a plurality of elements;

determining a composite centroid based on the elements of the first set;

determining a cross-spectral correlation function of the structure based on the composite centroid; and predicting a reaction of the structure to acoustic stimuli using the cross-spectral correlation function as the acoustic model of the structure.

14. The apparatus of claim 13, wherein the method performed by the computer-executable instructions further comprises:

calculating the spatial distance between the composite centroid and a second centroid.

15. An apparatus for creating an acoustic model of a structure based on a pre-existing finite element model of the structure, the apparatus comprising:

a processor;

a memory containing computer-executable instructions that, when executed on the processor, perform a method comprising the steps of;

partitioning elements of the finite element model into a plurality of sets with at least a first set having a plurality of elements;

determining a composite centroid based on the elements of the first set;

calculating the spatial distance between the composite centroid and a second centroid;

determining a cross-spectral correlation function of the structure based on the calculated spatial distance; and predicting a reaction of the structure to acoustic stimuli using the cross-spectral correlation function as the acoustic model of the structure.

16. The apparatus of claim 14, wherein the method performed by the computer-executable instructions further comprises:

determining a plurality of composite centroids based on separate sets of elements, and wherein the spatial distance device determines the spatial distances between each composite centroid.

17. An apparatus for creating an acoustic model of a structure based on a pre-existing finite element model of the structure, the apparatus comprising:

a processor;

a memory containing computer-executable instructions that, when executed on the processor, perform a method comprising the steps of;

partitioning elements of the finite element model into a plurality of sets with at least a first set having a plurality of elements;

determining a plurality of composite centroids based on separate sets of elements;

determining the spatial distances between each composite centroid;

determining a cross-spectral correlation function of the structure based on the calculated spatial distances; and predicting a reaction of the structure to acoustic stimuli using the cross-spectral correlation function as the acoustic model of the structure.

18. The apparatus of claim 13, wherein the first set is determined based on the position of each centroid of each element included in the first set.

19. The apparatus of claim 18, wherein the each set is partitioned based on the position of each centroid of each element of the finite element model.

20. The apparatus of claim 19, wherein the each set is determined based on the centroid position of each element of the finite element model relative to a collection of polygons superimposed over the structure.

21. An apparatus for creating an acoustic model of a structure based on a pre-existing finite element model of the structure, the apparatus comprising:

a processor;

a memory containing computer-executable instructions that, when executed on the processor, perform a method comprising the steps of;

partitioning elements of the finite element model into a plurality of sets with at least a first set having a plurality of elements;

determining a composite centroid based on the elements of the first set;

determining a cross-spectral correlation function of the structure based on the composite centroid; and predicting a reaction of the structure to acoustic stimuli using the cross-spectral correlation function as the acoustic model of the structure;

wherein the each set is determined based on the centroid position of each element of the finite element model relative to a regular array superimposed over the structure.

22. The apparatus of claim 21, wherein the regular array is an M-by-N array of rectangles, and wherein M and N are both integers and have a value greater than 1.

23. The apparatus of claim 22, wherein at least one of the partitioning device, centroid determining device and spatial distance calculator are substantially comprised of object-oriented code.

24. The apparatus of claim 13, wherein at least one of the partitioning device and centroid determining device are substantially comprised of object-oriented code.

25. The apparatus of claim 13, wherein the elements are derived based on a non-Cartesian coordinate system.

26. The apparatus of claim 25, wherein the elements are derived based on a cylindrical coordinate system.

27. A computer-readable storage medium that stores a plurality of instructions that, when executed by a processor, enable a processor-based system to operate on a finite element model representing a structure and containing a plurality of elements in creating an acoustic model of the structure, the instructions comprising:

a collection of one or more first object-oriented routines that, when executed by the processor, creates the acoustic model of the structure using the elements of the finite element model based on composite centroids of a plurality of finite elements stored on the computer readable storage media; and a means for cross-spectral correlation based on the composite centroids for predicting a reaction of a structure to acoustic stimuli.

28. The computer-readable storage medium of claim 27, wherein the first object-oriented routines include a first subset of one or more object-oriented routines capable of creating a composite centroid from the finite element model elements.

29. A computer-readable storage medium that stores a plurality of instructions that, when executed by a processor, enable a processor-based system to operate on a finite element model representing a structure and containing a plurality of elements in creating an acoustic model of the structure, the instructions comprising:

a collection of one or more first object-oriented routines that, when executed by the processor, creates the acoustic model of the structure using the elements of the finite element model based on composite centroids of a plurality of finite elements stored on the computer readable storage media; and a means for cross-spectral correlation based on the composite centroids for predicting a reaction of a structure to acoustic stimuli;

wherein:

the first object-oriented routines include a first subset of one or more object-oriented routines that, when executed by the processor, creates a composite centroid from the finite element model elements;

the first subset of one or more object-oriented routines, when executed by the processor, superimposes an array of regularly-spaced rectangles over the structure, then partitions the elements into sets based on the array of rectangles.

30. A computer-readable storage medium that stores a plurality of instructions that, when executed by a processor, enable a processor-based system to operate on a finite element model representing a structure and containing a plurality of elements in creating an acoustic model of the structure, the instructions comprising:

a collection of one or more first object-oriented routines that, when executed by the processor, creates the acoustic model of the structure using the elements of the finite element model based on composite centroids of a plurality of finite elements stored on the computer readable storage media; and a means for cross-spectral correlation based on the composite centroids for predicting a reaction of a structure to acoustic stimuli;

wherein the first object-oriented routines further include a second subset of one or more object-oriented routines that, when executed by a processor, calculates the spatial distances between the composite centroids.

31. The computer-readable storage medium of claim 30, wherein the first object-oriented routines further include a third subset of one or more object-oriented routines that, when executed by the processor, determines an acoustic function of the structure based on the calculated spatial distances.

32. A storage medium that stores a plurality of instructions that when executed, enables a processor-based system to operate on a finite element model representing a structure and containing a plurality of elements, the instructions comprising:

a first set of instructions that creates a composite centroid from a subset of the finite element model elements;

a second set of one or more instructions that calculates the spatial distances between the composite centroid and a second centroid; and a third set of instructions that determines an acoustic function of the structure based on the calculated spatial distance.

33. A method for creating an acoustic model of a structure based on a finite-element model of the structure, the method being performed by computer-executable instructions stored on a computer readable storage media that, when executed on a processor, perform a method comprising:

retrieving a finite-element model having a plurality of elements with each element having a centroid;

determining at least one composite centroid based on a first set of two or more first elements, the composite centroid having a spatial position and weight, the composite centroid being stored on the computer readable storage media;

determining a cross-spectral correlation function of the structure based on the composite centroid; and predicting a reaction of the structure to acoustic stimuli using the cross-spectral correlation function as the acoustic model of the structure;

wherein the first elements are assigned to a grid according to the composite centroid.

34. The method of claim 1, further comprising:

projecting nodes of finite element grid of the first elements onto the surface of a cylinder or plane;

converting the finite element nodes to a Cartesian system for determining of the centroids;

converting back the element centroids to a cylindrical coordinate system; and performing a paneling according to the planar paneling system.

35. A method for creating an acoustic model of a structure based on a finite-element model of the structure, the method being performed by computer-executable instructions stored on a computer readable storage media that, when executed on a processor, perform a method comprising:
- projecting a collection of polygons representing finite elements onto a surface;
- assigning each polygon to a grid rectangle;
- determining a bounding rectangle of the combined polygons and subdividing the rectangle into a grid to determine a centroid of each one of the polygons;
- assigning each one of the polygons to one of the arid rectangles according to the location of the centroid of the polygon;
- determining at least one composite centroid based on two or more polygons, the composite centroid having a spatial position and weight, the composite centroid being stored on the computer readable storage media;
- determining a cross-spectral correlation function of the structure based on the composite centroid; and
- predicting a reaction of the structure to acoustic stimuli using the cross-spectral correlation function as the acoustic model of the structure.

36. A method for creating an acoustic model of a structure based on a finite-element model of the structure, the method being performed by computer-executable instructions stored on a computer readable storage media that, when executed on a processor, perform a method comprising:
- retrieving a finite-element model having a plurality of elements with each element having a centroid;
- determining at least one composite centroid based on a first set of two or more first elements, the composite centroid having a spatial position and weight, the composite centroid being stored on the computer readable storage media;
- determining a cross-spectral correlation function of the structure based on the composite centroid; and
- predicting a reaction of the structure to acoustic stimuli using the cross-spectral correlation function as the acoustic model of the structure;
- wherein an acoustic field in the finite element model defines a series of partially correlated pressure loads that vary in the direction of a traveling wave.

* * * * *

UNITED STATES PATENT AND TRADEMARK OFFICE
CERTIFICATE OF CORRECTION

PATENT NO.      : 7,623,994 B2                                    Page 1 of 1
APPLICATION NO. : 10/898235
DATED           : November 24, 2009
INVENTOR(S)     : Rassaian et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1421 days.

Signed and Sealed this

Twenty-sixth Day of October, 2010

David J. Kappos
*Director of the United States Patent and Trademark Office*